United States Patent [19]

Hiraoka

[11] Patent Number: 4,770,974

[45] Date of Patent: Sep. 13, 1988

[54] MICROLITHOGRAPHIC RESIST CONTAINING POLY(1,1-DIALKYLSILAZANE)

[75] Inventor: Hiroyuki Hiraoka, Saratoga, Calif.

[73] Assignee: International Business Machines Corporation, Armonk, N.Y.

[21] Appl. No.: 78,321

[22] Filed: Jul. 27, 1987

Related U.S. Application Data

[63] Continuation of Ser. No. 908,748, Sep. 18, 1986, abandoned.

[51] Int. Cl.$^4$ .............................................. G03C 1/76
[52] U.S. Cl. ................................... 430/270; 430/272; 430/905; 430/325; 430/326; 522/111; 522/148
[58] Field of Search ............... 430/905, 270, 272, 325, 430/326; 522/102, 111, 148

[56] References Cited

U.S. PATENT DOCUMENTS 3,911,169 10/1975 Lesaicherre et al. ................. 427/96
4,451,969 6/1984 Chaudhuri ............................. 29/572
4,599,243 7/1986 Sachder et al. ...................... 430/314

OTHER PUBLICATIONS

Ueno et al., Preprints of the 4th Technical Conference on Photopolymers, Jul. 11–12, 1985, Tokyo, Japan.

Primary Examiner—Jack P. Brammer
Attorney, Agent, or Firm—Joseph G. Walsh

[57] ABSTRACT

A resist composition is made resistant to reactive ion etching by admixing therewith a poly(dialkylsilazane).

6 Claims, No Drawings

MICROLITHOGRAPHIC RESIST CONTAINING POLY(1,1-DIALKYLSILAZANE)

The present application is a continuation of co-pending application, Ser. No. 06/908,748, filed Sept. 18, 1986 and now abandoned.

DESCRIPTION

1. Technical Field

The present invention is concerned with microlithographic resists which are resistant to oxygen reactive ion etching and also resistant to thermal flow.

2. Background Art

U.S. Pat. No. 3,911,169 shows the use of polysilazane to treat a substrate surface before the surface is coated with a photoresist. The polysilazane is used as an adhesive, and it is not mixed with the photoresist.

U.S. Pat. No. 4,451,969 shows polysilazane coated onto a substrate, and then converted to silicon nitride. Polysilazane is never mixed with the photoresist.

Ueno et al, Preprints of the 4th Technical Conference on Photopolymers, July 11-12, 1985, Tokyo, Japan, shows an aqueous alkali developable positive photoresist which contains silicon containing compounds very different from those used in the present invention.

DISCLOSURE OF THE INVENTION

According to the present invention, photoresists which are resistant to reactive ion etching are provided by admixing with a photoresist a poly(dialkylsilazane). It has been discovered that poly(dialkylsilazane) is phase compatible with a wide variety of both positive and negative resists and gives excellent films. There is no phase separation and little change in sensitivity because of the addition of the poly(dialkylsilazane). High temperature flow resistance and high resolution are also obtained. Thus, there is achieved great simplification in processing to make resists resistant to RIE.

The poly(1,1-dialkylsilazane) materials useful in the present invention have the general formula

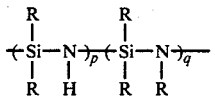

wherein R is a lower alkyl such as methyl or ethyl and the ratio q to p is between 0 and 1. This may be expressed in other words by saying that from 100% to 50% of the monomeric units have hydrogen attached directly to the nitrogen atom, with the remainder of the monomeric units having only alkyl groups attached to the nitrogen atom, and with the alkyl groups being methyl or ethyl. The most preferred material is poly(1,1-dimethylsilazane). Such materials are well known in the art and are commercially available. In use in the present invention the polysilazane should preferably be of sufficiently high molecular weight that it is a solid or nearly a solid.

Many microlithography resists mix well with poly(1,1-dimethylsilazane) without phase separation and give excellent films; for examples, as negative resists chlorinated polystyrene, chloromethylated poly(isopropenylnaphthalene) and polystyrene, and as positive resists novolac-type photoresists, poly(hydroxystyrene) and poly(t-Boc-styrene)-based resists. With a small amount of the polysilazane in the matrix resists (15% in solid) oxygen RIE rates of these resists become nil. The images can be developed in the same condition as the one without the polysilazane under proper prebaking condition. Besides RIE resistance, thermal flow resistance is enhanced. Because the mixtures are independent of diffusion or uv-absorption process, any thick films can be processed. The amount of polysilazane additive is generally quite small, i.e. about 15% by weight of solids.

The positive matrix resist composition of the present invention should preferably be stored in a refrigerator before use. For the negative tone resists, such precaution is not necessary.

The following examples are given solely for purposes of illustration. Many variations will occur to those skilled in the art, without departing from the spirit or scope of the invention.

Formulation of resist solutions: Chlorinated poly(methylstyrene) dissolves poly(1,1-dimethlsilazane) uniformally without phase separation; because the oxygen RIE rate becomes nil at its concentration of 15% in solid the experiments were carried out in this dilute concentration range. Chlorobenzene solution of poly(4-chlorostyrene) readily dissolves poly(1,1-dimethylsilazane) without incompatibility.

These negative tone resist solutions with. poly(1,1-dimethylsilazane) gave uniform smooth films upon spin-coating onto silicon wafers. Poly(chloromethylstyrene) and poly(chloromethylstyrene)-based films on silicon wafers were prebaked at 90° C. for 30 min; poly(chlorostyrene) and poly(chlorostyrene)-based films were prebaked at 120° C. for 30 min.

The mixture of diazoquinone sensitized novolac photoresists and poly(1,1-dimethylsilazane) discolored while standing at room temperature for several days. Otherwise, the mixture gave uniform films. After dissolving the polysilazane in novolac photoresist solution, a fine grade glass filter filtration was done because of the presence of gas bubbles and small particles or dust. After prebaking at 70° C. for 8 min (70°–75° C. prebaking recommended) the resist films were exposed to uv-light, and developed in aqueous alkali solution.

RIE etch rate measurement: A Plasma Therm MPC-500 RIE equipment was used for oxygen RIE exposure in the following condition: 60 mTorr pressure, 40 sccm flow rate, 150 W incident power with 0.245 W/cm$^2$ power density, and −250 V bias potential. After every three minutes the film thickness of exposed resist layers was measured with a Alpha Step 200.

Image fabrication: Negative tone images of poly(chloromethylstyrene) and of its mixed resist with poly(1,1-dimethylsilazane) were made with a quartz mask of Opto-Line and a medium pressure mercury lamp in a direct contact mode. Images were developed in 2-ethoxyethyl acetate and hexane solution. The purpose of image fabrication is to find the relative sensitivity of the mixed resist to poly(chloromethylstyrene), and the quality of developed films.

Bilayer application: Polyimide was spin-coated onto a silicon wafer at 3000 rpm to yield 5 μm thick polyimide layer; then, prebaked at 120° C. for 60 min. Copolymer of styrene and maleic anhydride and poly(dimethylglutarimide) films were also similarly spin-coated and prebaked on a hot plate and used as a underlying layer.

Oxygen RIE rates: Oxygen RIE rates of the matrix resists were measured as a function of the concentration of poly(1,1-dimethylsilazane) in solid content. The results clearly show that the maximum concentration required for the significant reduction of the etch rate is about 15% of the polysilazane concentration in solid, and only 5% of silicon weight % in solid content.

Image fabrication and high temperature flow resistances: Through a quartz mask of Opto-Line the resist films were exposed for 30 sec and then developed in a 4:1 mixture of 2-ethoxyethyl acetate and hexane. The best results were obtained with 14 to 20% transparent areas. The sensitivity comparison of the matrix resist containing 10% poly(dimethylsilazane) in solid with poly(chloromethylstyrene) resist showed no change in deep uv-exposure.

The matrix resists of diazo naphthoquinone-sensitized novolac photoresists and poly(1,1-dimethylsilazane) developed completely where the resist films were prebaked at 70°–75° C. for less than 20 min. High temperature heating flows the images only slightly, not as bad as in the photoresist. The resist images appear to flow slightly at a rather low temperature. Once the heating passes through that temperature, images stay constant, indicating kinetic competition of thermal flow and cross-linking of the polysilazane and novolac resin.

Image transfer to underlaying organic layers: With the negative tone poly(chloromethylstyrene)-based matrix resist, poly(methyl methacrylate), poly(methacrylic acid), polyimide, copolymer of maleic anhydride and styrene, and poly(dimethyl-glutarimide) are used as underlying polymer layers. On top of each of these polymer films the matrix resist of poly(chloromethylstyrene) and poly(dimethylsilazane) was spin-coated and prebaked at 110° C. for 30 min. Deep uv-exposure with an Opto-Line mask and image transfer to underlying layers with a Plasma Therm RIE etcher were carried out as described above. For the polyimide, and a copolymer of styrene and maleic anhydride, a higher concentration of the polysilazane was required to sustain the imaged film during the RIE process. With a matrix resist of sensitized novolac and the polysilazane a conventional photomask with WICKET images was used in conjunction with a medium pressure mercury lamp. As an underlying layer 7 μm thick polyimide was used with an 1.5 μm thick imaging layer of the novolac containing 10% poly(1,1-dimethylsilazane) in solid content. The image transfer by oxygen RIE in our condition took 60 min for complete image development in polyimide layer. The erosion of the imaging layer thickness was seen after prolonged RIE, indicating a higher content of the polysilazane advisable for such thick image transfer.

Surface changes during oxygen RIE: ESCA studies of the surface changes of the matrix resist of poly(chloromethylstyrene) and poly(1,1-dimethylsilazane) by oxygen RIE were carried out as a function of the polysilazane content. The 3.6% silazane content resist film still rapidly etches but the etch rate of 11.5% silazane content resist is almost nil for the initial 12 min.

After 9 min oxygen RIE, the surface silicon concentration of the low silazane content films became almost the same as the high silazane content films. Yet, this low silazane content films continued being etched away in oxygen RIE, while the high silazane content films showed no thickness loss under this condition. The result clearly indicates the importance of the initial silicon content, or how densely packed is the silicon on the surface. After a long oxygen RIE even the initially resistant film starts eroding. If it were sputtering effect, the erosion should show even at the start of the RIE.

The silicon binding energy shifted to a higher energy after oxygen RIE. Together with increase of an oxygen content, a $SiO_2$ layer believed to cover the resist surface to stop the oxygen etch. However, as can be seen in the 11.5% silazane film, still a significant amount of carbon was present after 9 min oxygen RIE, indicating that the carbon was playing an integral part of the etch barrier layer. A small amount of $SiO_2$ appears to be insufficient to cover a whole surface of resist films. The nitrogen signal became nil after the oxygen RIE, indicating its removal from the silazane structure.

I claim:

1. A microlithographic resist composition consisting essentially of a photoresist-forming resin and admixed therewith, in an amount from about 3.6% to about 15% by weight of said resist composition, a poly(dialkyl-silazane) in which from 100% to 50% of the monomeric units have hydrogen attached directly to the nitrogen atom, with the remainder of the monomeric units having only alkyl groups attached to the nitrogen atom, and with the alkyl groups being either methyl or ethyl.

2. A composition as claimed in claim 1 wherein the poly(dialkylsilazane) is poly(1,1-dimethylsilazine).

3. A composition as claimed in claim 1 wherein the resist is a positive resist.

4. A composition as claimed in claim 1 wherein the resist is a negative resist.

5. A composition as claimed in claim 1 wherein the resist resin is a novolac resin.

6. A composition as claimed in claim 1 wherein the poly(dialkylsilazane) is a solid.

* * * * *